(12) United States Patent
Xue et al.

(10) Patent No.: US 11,127,794 B2
(45) Date of Patent: Sep. 21, 2021

(54) DISPLAY SCREENS AND DISPLAY DEVICES INTEGRATED WITH THE SAME

(71) Applicant: Kunshan Go-Visionox Opto-Electronics Co., Ltd., Kunshan (CN)

(72) Inventors: Xiaofei Xue, Kunshan (CN); Zhihua Zhang, Kunshan (CN)

(73) Assignee: KUNSHAN GO-VISIONOX OPTO-ELECTRONICS CO., LTD., Kunshan (CN)

( * ) Notice: Subject to any disclaimer, the term of this patent is extended or adjusted under 35 U.S.C. 154(b) by 0 days.

(21) Appl. No.: 16/568,276

(22) Filed: Sep. 12, 2019

(65) Prior Publication Data

US 2020/0006442 A1    Jan. 2, 2020

Related U.S. Application Data

(63) Continuation of application No. PCT/CN2018/089388, filed on May 31, 2018.

(30) Foreign Application Priority Data

Oct. 31, 2017   (CN) .......................... 201721426690.2

(51) Int. Cl.
    *H01L 27/32*    (2006.01)
    *G09G 3/00*    (2006.01)

(52) U.S. Cl.
    CPC ............ *H01L 27/3211* (2013.01); *G09G 3/00* (2013.01); *G09G 2380/02* (2013.01)

(58) Field of Classification Search
    CPC ...... H01L 27/3211; H01L 51/524; G09F 9/00; G09G 3/00
    See application file for complete search history.

(56) References Cited

U.S. PATENT DOCUMENTS

| 2014/0133046 A1* | 5/2014 | Sung | G02F 1/1335 |
| | | | 359/893 |
| 2015/0211707 A1* | 7/2015 | Watanabe | G09G 3/3607 |
| | | | 345/667 |
| 2018/0067357 A1 | 3/2018 | Katsuta | |

FOREIGN PATENT DOCUMENTS

| CN | 205334901 U | 6/2016 |
| CN | 106707606 A | 5/2017 |
| CN | 206441731 U | 8/2017 |
| CN | 107807480 A | 3/2018 |
| CN | 207397613 U | 5/2018 |
| WO | 2019085462 A1 | 5/2019 |

OTHER PUBLICATIONS

International Search Report dated Jul. 25, 2018 in the corresponding International application (application No. PCT/CN2018/089388).

\* cited by examiner

*Primary Examiner* — Mohammed R Alam
(74) *Attorney, Agent, or Firm* — Kilpatrick Townsend & Stockton

(57) ABSTRACT

The present disclosure relates to a display screen and a display device integrated with the same. The display screen includes: a screen body having an active display area defined by a contour line, and a cover plate covering the screen body. The cover plate has a cover area corresponding to corners of the active display area, and the cover area covers the corners.

20 Claims, 4 Drawing Sheets

DISPLAY SCREENS AND DISPLAY DEVICES INTEGRATED WITH THE SAME

CROSS-REFERENCES TO RELATED APPLICATIONS

This application is a continuation application of International Application No. PCT/CN2018/089388, filed on May 31, 2018, entitled "DISPLAY SCREEN AND DISPLAY DEVICE INTEGRATED WITH THE SAME", which claims priority to Chinese Patent Application No. 201721426690.2, filed on Oct. 31, 2017. Both applications are incorporated by reference herein for all purposes.

TECHNICAL FIELD

The present disclosure relates to a field of display technology.

BACKGROUND

The electronic display screen has an active display area defined by contour lines. With the development of electronic technology, electronic display screens have become more diverse. For example, the active display area is provided with chamfers, so as to improve the visual experience. Typically, the pixel units are distributed along the contour line, so as to meet the display needs of the active display area provided with the chamfer.

SUMMARY

Accordingly, it is necessary to provide a solution to the problem of the jaggedness of displaying.

A display screen, includes: a screen body having an active display area defined by a contour line; and a cover plate covering the screen body.

The cover plate has a cover area corresponding to corners of the active display area, and the cover area is configured to cover the corners.

In one of the embodiments, the cover plate is plate shaped and entirely covers the active display area, and the cover area is located at an edge of the cover plate.

In one of the embodiments, the cover plate is frame shaped and covers edges and corners of the active display area, and the cover area is entirely distributed in the cover plate.

In one of the embodiments, the cover plate is plate shaped or frame shaped, and the cover area is corresponding to the corners of the active display area.

In one of the embodiments, the cover area has a light transmittance lower than 80%.

In one of the embodiments, the cover area at least includes a shading layer made of a material having the light transmittance lower than 80%.

In one of the embodiments, the cover area is made of the material having the light transmittance lower than 80%.

In one of the embodiments, the cover area is coated with an ink having the light transmittance lower than 80%.

In one of the embodiments, the ink is a non-transparent ink.

The present disclosure also provides a display device integrated with any one of aforementioned display screens, it includes any one of display screens according to the aforementioned embodiments.

In one of the embodiments, the display device of the display screen includes: a power module, or called as a power circuit, used to supply power to the display screen; a storage module, or called as a storage circuit, storing media information; and a processing module, or called as a processing circuit, electrically coupled to the display screen, the power module, and the storage module to control power supply of the power module, and display the media information on the display screen.

The technical solution provided by the present disclosure has at least the following beneficial effects: since the cover plate has a cover area corresponding to corners of the active display area, and the cover area covers the corners, the brightness of the jagged pixel units at the corners of the active display area is reduced, thereby reducing the jaggedness and improving the display effect.

DETAILED DESCRIPTION OF THE INVENTION

In the process of implementing display technologies, the applicants found that:

The contour line defining the active display area is a smooth curve, and the pixel unit or sub-pixel is an entity having a certain size, therefore when the contour line is fitted by the pixel units or the sub-pixels, the picture displayed at the chamfer of the contour line (i.e., the corner of the active display area) will show jaggedness and affect the display effect.

Figure 1:
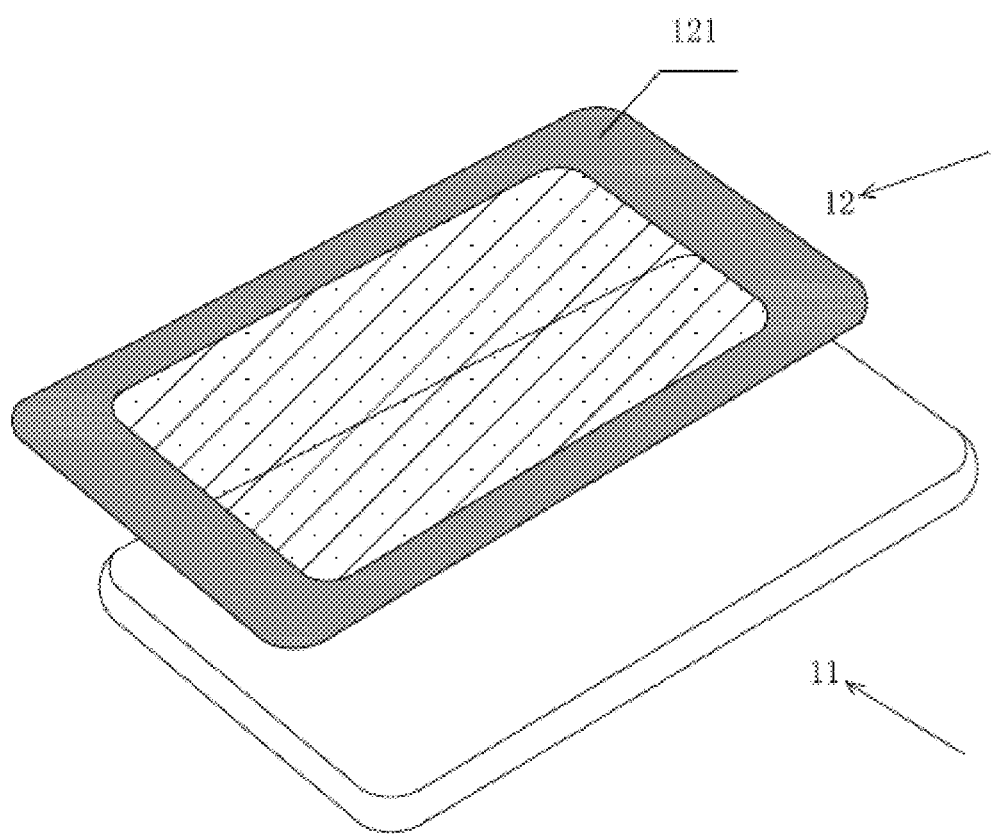
FIG. 1 is a structure schematic view of a display screen according to the present disclosure.

As shown in FIG. 1, FIG. 1 is a structure schematic view of a display screen. The display screen includes a screen body 11 and a cover plate 12. The screen body 11 has a contour line to define a range of an active display area. The active display area is inside the contour line, and the borderline of the active display area is the contour line. The active display area can be used to present pictures or dynamic display images. When the active display area is provided with a touch sensor, the operator's motion can also be sensed and responded. In specific applications, the display screen can be a curved surface screen of a television or a mobile phone.

The display screen can include two glass substrates and a light emitting layer provided between the two glass substrates. In general, the light emitting layer may include an anode, a cathode, and an emitting material provided between the anode and the cathode, and the emitting material is excited by a potential difference between the anode and the cathode to emit light. The light emitting layer can form a plurality of pixel units, and each pixel unit can include a plurality of sub-pixels. In general, the pixel unit can include a first sub-pixel, a second sub-pixel, and a third sub-pixel. The first sub-pixel may be a red R sub-pixel, the second sub-pixel may be a green G sub-pixel, and the third sub-pixel may be a blue B sub-pixel. The screen body 11 may further include a driving circuit to drive the pixel unit to emit light. The screen body 11 is distributed with pixel units that constitute the active display area. For the designed display screen, the contour line of the screen body 11 is determined, and the pixel units need to be arranged within the range defined by the contour line. For locations adjacent to the contour line, the pixel units or sub-pixels need to be arranged along the shape of the contour line.

The cover plate 12 covers the screen body 11, so as to protect the screen body 11. In specific applications, the screen body 11 can include two substrates and a light emitting layer provided between the two substrates, and the cover plate 12 can be a structure provided on the outer substrate. In an alternative embodiment, the cover plate 12 can be the outer substrate itself, and the screen body 11 can include the inner substrate and the light emitting layer provided between the inner substrate and the outer substrate. The material of the substrate may be a polyimide (PI) flexible plastic substrate or a glass substrate.

The cover plate 12 has a cover area 121 corresponding to corners of the active display area, so as to improve the display effect of the active display area.

As shown in FIG. 1, in one of the embodiments, the cover plate 12 is plate shaped and entirely covers the active display area, and the cover area 121 is located at an edge of the cover plate 12.

The inner border line of the cover area 121 coincides with the contour line of the designed screen body 11, or that is to say, the inner border line of the cover area 121 is adaptively customized according to the contour line of the designed screen body 11. In this way, the area defined by the cover area 121 reduces the brightness or become opaque, such that the jaggedness can be reduced and the display effect can be improved.

Figure 2:
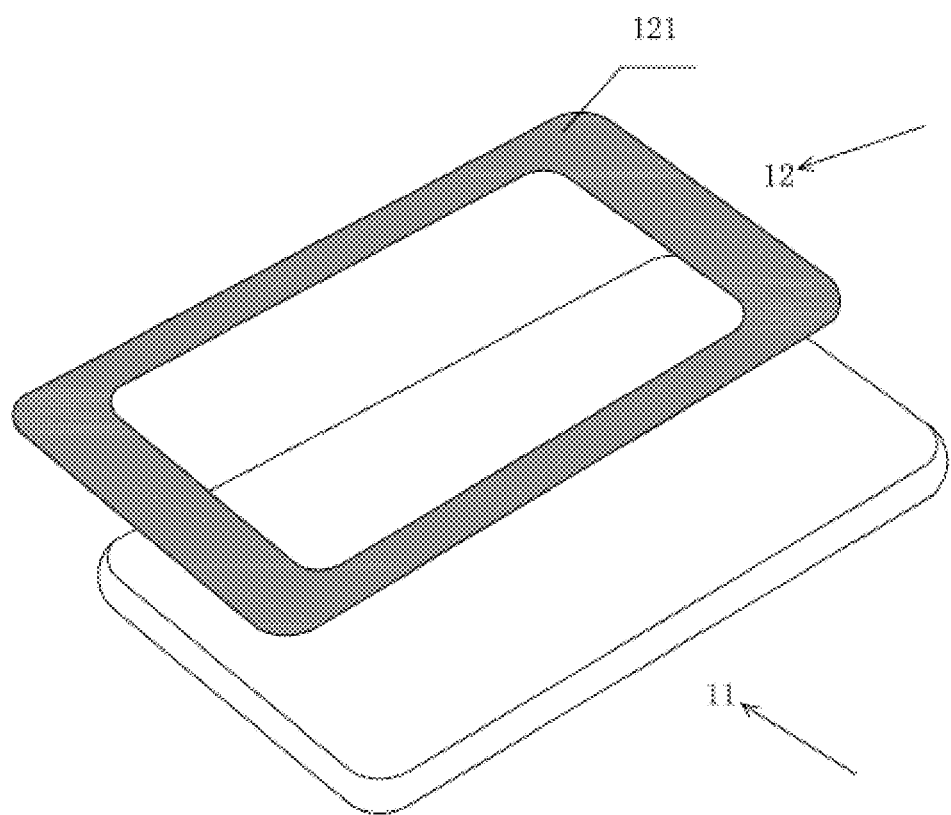
FIG. 2 is a structure schematic view of another display screen according to the present disclosure.

As shown in FIG. 2, which shows an alternative embodiment of the present disclosure, the cover plate 12 is frame shaped and covers edges and corners of the active display area, and the cover area 121 is entirely distributed in the cover plate 12.

Specifically, the cover plate 12 has a hollow frame shape. The cover area 121 is entirely distributed the non-hollow area of the cover plate 12. In contrast to the previous embodiment, the cover plate 12 herein is hollowed out in the middle. Similarly, the inner border line of the cover area 121 coincides with the contour line of the designed screen body 11. In this way, the area defined by the cover area 121 reduces the brightness or become opaque, such that the jaggedness can be reduced and the display effect can be improved.

Figure 3:
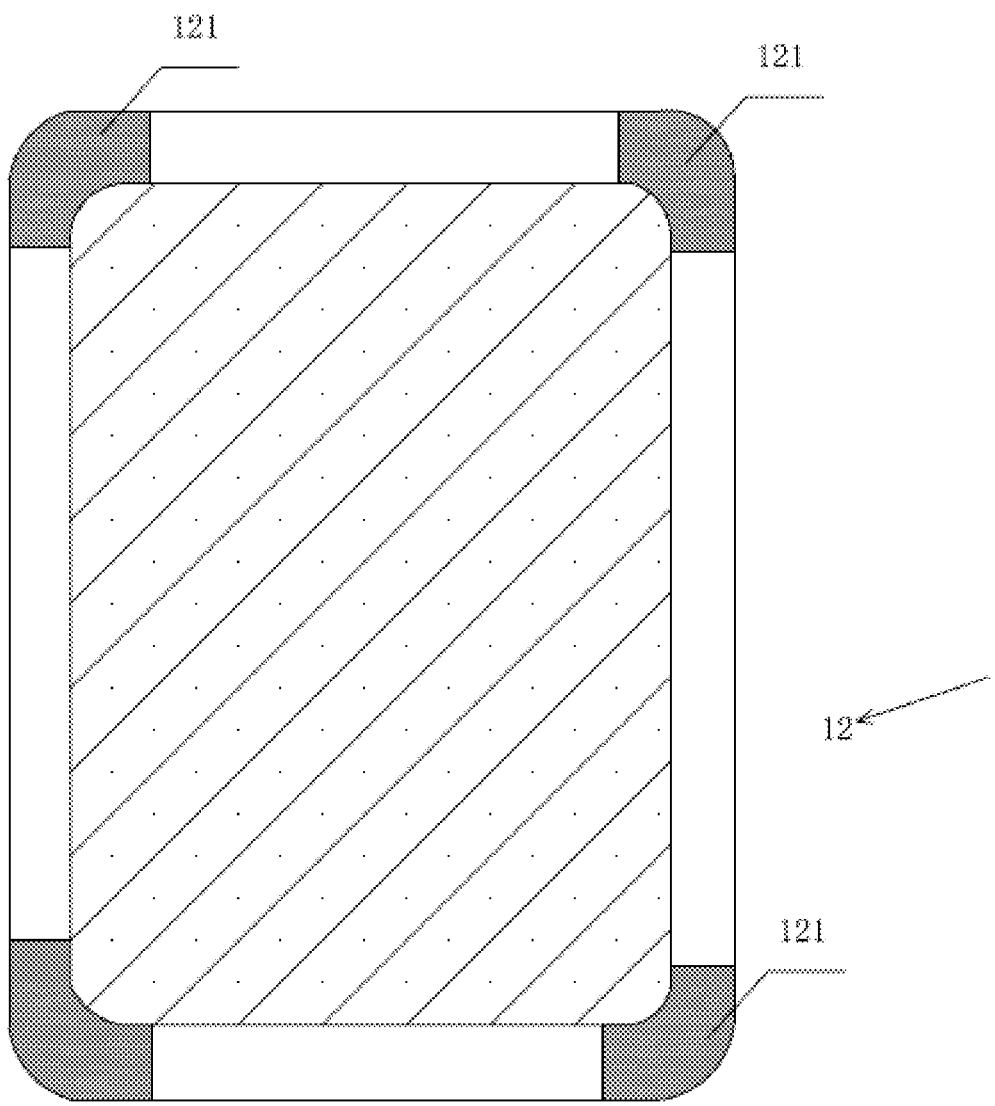
FIG. 3 is a structure schematic view of a cover plate of another display screen according to the present disclosure.

As shown in FIG. 3, which shows another alternative embodiment of the present disclosure, the cover plate 12 is plate shaped, and the cover area 121 is corresponding to the corners of the active display area.

Specifically, the cover plate 12 has a plate shape. The cover area 121 is corresponding to the corners of the active display area. It is assumed that for an active display area that generally is substantially square, the active display area has four corners. Correspondingly, the cover area 121 has four sub-areas, and each sub-area correspondingly covers a corner of the active display area.

Figure 4:
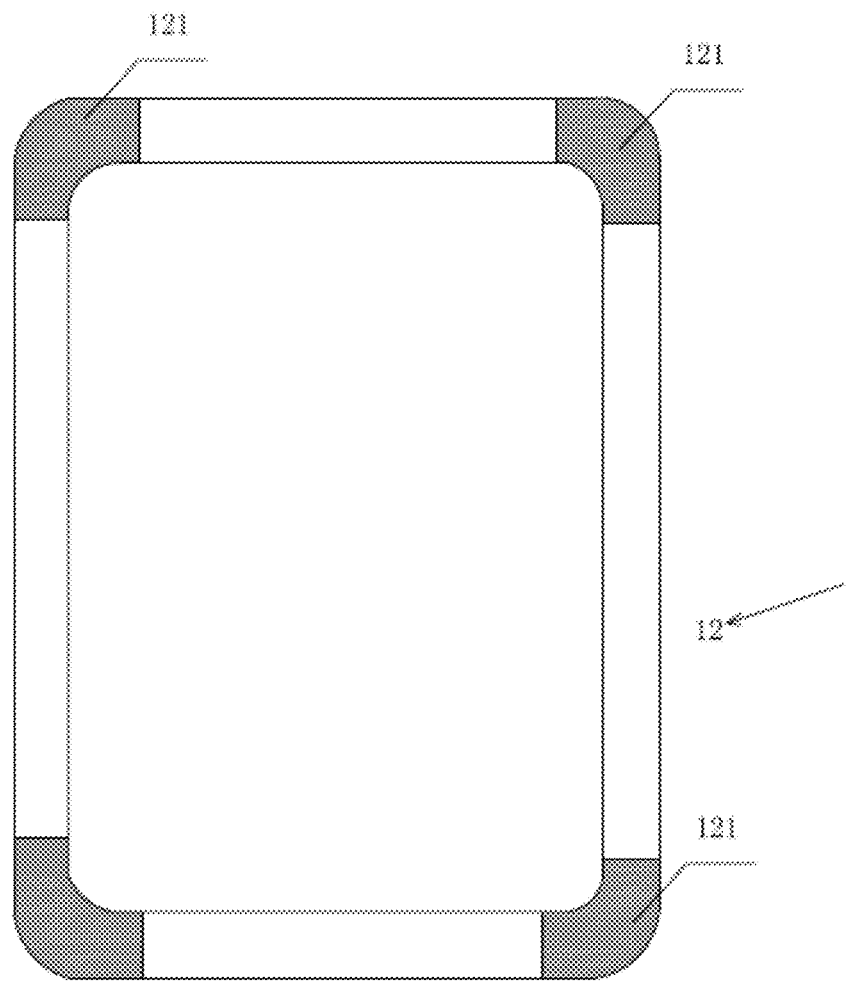
FIG. 4 is a structure schematic view of a cover plate of yet another display screen according to the present disclosure.

As shown in FIG. 4, which shows another alternative embodiment of the present disclosure, the cover plate 12 is frame shaped, and the cover area 121 is corresponding to the corners of the active display area.

Specifically, the cover plate 12 has a frame shape. The cover area 121 is corresponding to the corners of the active display area. It is assumed that for an active display area that generally is substantially square, the active display area has four corners. Correspondingly, the cover area 121 has four sub-areas, and each sub-area correspondingly covers a corner of the active display area. In contrast to the embodiment in FIG. 3, the cover plate herein has a hollow frame shape.

The above is an explanation of the arrangement of the cover area 121 of the cover plate 12, and the specific structure of the cover area 121 will be described below. In order to achieve the purpose that the brightness of the area defined by the cover area 121 is reduced or the area becomes opaque so as to improve the display effect, the light transmittance of the cover area 121 can be set as lower than 80%

In yet another embodiment according to the present disclosure, the cover area 121 at least includes a shading layer made of a material having the light transmittance lower than 80%.

Specifically, the cover area 121 can have a plurality of layers, and one of the layers is made of the material having the light transmittance lower than 80%.

The material having the light transmittance lower than 80% for example can be one or more materials of sunshade type low-e glass, polypropylene, or polyamide. Preferably, it can be made of a non-transparent material.

In yet another embodiment according to the present disclosure, the cover area 121 is coated with an ink having the light transmittance lower than 80%.

The ink having the light transmittance lower than 80% can be preferably a non-transparent ink. Specifically, the ink can be for example an aqueous ink, an ultraviolet curable ink, or an aqueous UV ink. Alternatively, the non-transparent ink is neither limited to the options of non-transparent ink in the embodiment, nor limited to one or more certain types of non-transparent ink, as long as it can shade the illuminating of the pixel unit and reduce or completely shade the light emitted from the pixel unit.

A display device is provided according to the present disclosure. The display device includes a display screen according to any one of the aforementioned embodiments, a power module or called as a power circuit used to supply power to the display screen, a storage module or called as a storage circuit used to store media information, and a processing module or called as a processing circuit electrically coupled to the display screen, the power module, and the storage module. The processing module is used to control power supply of the power module, and display the media information on the shaped display screen.

The storage module used to store media information. When the display device is working, the display picture of the display screen is control by the media information stored in the storage module.

The processing module is used to process the information. The processing module is electrically coupled to the display screen, the power module, and the storage module. When the display device is working, the processing module controls the power supply of the power module, and provide the electric power to the display screen. After the different pixel units in the light emitting layer receiving the processing signal from the processing module, the pixel units emit lights according to the processing signal. The processing signal can control the light emitting order, the light emitting time, and the brightness of the pixel units.

Although the present disclosure is illustrated and described herein with reference to specific embodiments, the present disclosure is not intended to be limited to the details shown. It is to be noted that, various modifications may be made in the details within the scope and range of equivalents of the claims and without departing from the present disclosure. Therefore, the protection scope of the present disclosure shall be subject to the protection scope of the claims.

The invention claimed is:

1. A display screen, comprising:
    a screen body having an active display area defined by a contour line; and
    a cover plate covering the screen body;
    wherein the cover plate has a cover area corresponding to corners of the active display area, wherein the cover area has a light transmittance lower than the rest of the cover plate and only the corners of the active display area are covered by the cover area of the cover plate.

2. The display screen according to claim 1, wherein the cover plate is plate shaped and entirely covers the active display area, and the cover area is located at an edge of the cover plate.

3. The display screen according to claim 1, wherein the cover plate is frame shaped and covers edges and corners of the active display area, and the cover area is entirely distributed in the cover plate.

4. The display screen according to claim 1, wherein the cover plate is plate shaped or frame shaped, and the cover area is corresponding to the corners of the active display area.

5. The display screen according to claim 1, wherein the cover area has a light transmittance lower than 80%.

6. The display screen according to claim 1, wherein the cover area at least comprises a shading layer made of a material having a light transmittance lower than 80%.

7. The display screen according to claim 6, wherein the cover area comprises a material having the light transmittance lower than 80%.

8. The display screen according to claim 6, wherein the cover area is coated with an ink having the light transmittance lower than 80%.

9. The display screen according to claim 8, wherein the ink is a non-transparent ink.

10. A display device integrated with a display screen, comprising the display screen comprising:
    a screen body having an active display area defined by a contour line; and
    a cover plate covering the screen body;
    wherein the cover plate has a cover area corresponding to corners of the active display area, wherein the cover area has a light transmittance lower than the rest of the cover plate and only the corners of the active display area are covered by the cover area of the cover plate.

11. The display device integrated with the display screen according to claim 10, comprising:
    a power module used to supply power to the display screen;
    a storage module storing media information; and
    a processing module electrically coupled to the display screen, the power module, and the storage module to control power supply of the power module, and display the media information on the display screen.

12. The display screen according to claim 1, wherein the cover area has a plurality of discrete sub-areas formed at corner areas thereof, only corners of the active display area are covered by the corresponding sub-areas of the cover area.

13. The display screen according to claim 1, wherein the cover area comprises a plurality of layers, and one of the layers comprises one or more materials of sunshade type low-e glass, polypropylene, and polyamide.

14. The display device integrated with the display screen according to claim 10, wherein the cover plate is plate shaped and entirely covers the active display area, and the cover area is located at an edge of the cover plate.

15. The display device integrated with the display screen according to claim 10, wherein the cover plate is frame shaped and covers edges and corners of the active display area, and the cover area is entirely distributed in the cover plate.

16. The display device integrated with the display screen according to claim 10, wherein the cover plate is plate shaped or frame shaped, and the cover area is corresponding to the corners of the active display area.

17. The display device integrated with the display screen according to claim 10, wherein the cover area has a light transmittance lower than 80%.

18. The display device integrated with the display screen according to claim 10, wherein the cover area at least comprises a shading layer made of a material having a light transmittance lower than 80%.

19. The display device integrated with the display screen according to claim 17, wherein the cover area comprises a material having the light transmittance lower than 80%.

20. The display device integrated with the display screen according to claim 19, wherein the material comprises an aqueous ink, an ultraviolet curable ink, or an aqueous UV ink.

* * * * *